United States Patent [19]

Nagayasu

[11] Patent Number: 5,340,756

[45] Date of Patent: Aug. 23, 1994

[54] METHOD FOR PRODUCING SELF-ALIGNED LDD CMOS, DMOS WITH DEEPER SOURCE/DRAIN AND P-BASE REGIONS AND, BIPOLAR DEVICES ON A COMMON SUBSTRATE

[75] Inventor: Yoshihiko Nagayasu, Kawasaki, Japan

[73] Assignee: Fuji Electric Co., Ltd., Kawasaki, Japan

[21] Appl. No.: 71,016

[22] Filed: Jun. 2, 1993

[30] Foreign Application Priority Data

Jun. 3, 1992 [JP] Japan .................. 4-141848

[51] Int. Cl.⁵ .................. H01L 21/265; H01L 21/70
[52] U.S. Cl. .................. 437/34; 437/41; 437/57
[58] Field of Search .................. 437/41, 57, 34

[56] References Cited

U.S. PATENT DOCUMENTS

| | | | |
|---|---|---|---|
| 4,878,096 | 10/1989 | Shinai et al. | 357/42 |
| 4,887,142 | 12/1989 | Bertotti et al. | 357/43 |
| 4,945,070 | 7/1990 | Hsu | 437/160 |
| 5,045,492 | 9/1989 | Huieo et al. | 437/57 |
| 5,108,944 | 9/1991 | Shirai et al. | 437/57 |
| 5,156,989 | 10/1992 | Williams et al. | 437/41 |
| 5,171,699 | 12/1992 | Hutter et al. | 437/34 |
| 5,220,218 | 6/1993 | Hill et al. | 307/482.1 |
| 5,237,193 | 8/1993 | Williams et al. | 257/336 |
| 5,242,841 | 9/1993 | Smayling et al. | 437/29 |
| 5,256,582 | 10/1993 | Mosher et al. | 437/31 |

OTHER PUBLICATIONS

Seiki Ogura et al, "Design and Characteristics of the Lightly Doped Drain-Source (LDD) Insulated Gate Field-Effect Transistor", *IEEE Transactions on Electron Devices*, vol. ED-27, No. 8, Aug. 1980, pp. 1359-1367.

Primary Examiner—Tom Thomas
Assistant Examiner—Lynne A. Gurley
Attorney, Agent, or Firm—Spencer, Frank & Schneider

[57] ABSTRACT

A low-concentration region is formed by ion implanting a P-well with P+ using a gate as a mask, then an N-well is ion-implanted with As+ and B+ using a resist film and the gate as a mask to form a DMOSFET having a double-diffused drain structure. Then, the gate and an insulation material are used as a mask to ion-implant the P-well with As+ to form a CMOSFET having a lightly doped drain structure. After that, the N-well is ion-implanted with $BF_2^+$ through an opening to connect a P base region with a P base-contact region. The source/drain and p-base regions of the DMOS device are formed deeper than those of the CMOS device. Incorporation of a bipolar transistor is also disclosed. All devices are formed on the same substrate.

7 Claims, 9 Drawing Sheets

METHOD FOR PRODUCING SELF-ALIGNED LDD CMOS, DMOS WITH DEEPER SOURCE/DRAIN AND P-BASE REGIONS AND, BIPOLAR DEVICES ON A COMMON SUBSTRATE

BACKGROUND OF THE INVENTION

1. Field of the Invention

The present invention relates to a method for producing a semiconductor device, more specifically, to a method for producing a semiconductor device in which a CMOSFET having a lightly doped drain (LDD) structure and a double-diffused MOSFET (DMOS) are integrated on a same semiconductor substrate.

2. Description of the Prior Art

A MOSFET is known to have a current injected into a gate oxide film and a current flowing through a substrate, in addition to a current flowing through a channel. So-called hot carriers participate in the generation of these currents. Electrons as the hot carriers travel in an electric field E which is defined as $E = V_{DS}/L_{eff}$. Therefore, when the value of the voltage $V_{DS}$ between the source and the drain is constant, the electric field E increases and the hot carriers gain a high energy as an effective channel length $L_{eff}$ becomes smaller. In a MOSFET with the effective channel length $L_{eff}$ of 1 µm or less the electric field becomes up to about $10^5$ V/cm in the vicinity of the drain. It is unfavorable for the characteristics of the device that the hot carriers flow in the strong electric field. Various structures are proposed to reduce variations in characteristics of the device due to the hot carriers. Basically, these proposed structures relax the electric field in the vicinity of the drain and reduce the substrate current. Ordinary MOSFETs have a drain with high impurity concentrations, and in most MOSFETs, the electric field is considerably concentrated in the vicinity of the drain, and a large amount of the hot carriers is generated, which tend to degrade the characteristics of the MOSFET.

To reduce the generation of the hot carriers, it is preferable to reduce the dopant concentration of the drain, thereby preventing the electric field from concentrating. As one of the methods for this purpose, there has been known as a lightly doped drain structure (S. Ogura et al, "Design and Characteristics of the Lightly Doped Drain-Source (LDD) Insulated Gate Field-Effect Transistor," IEEE Transactions on Electron Devices, vol. ED-27, No. 8 (1980) 1359–1367). In a MOSFET of this type, as compared with ordinary MOSFETs, the substrate current is reduced by a factor of 1–2 figures, and the gate current is reduced by a factor of 3–4 figures, to almost undetectable levels. Furthermore, the drain withstanding voltage under a condition where a drain current is flowing is remarkably improved, achieving a withstanding voltage for satisfactory operation even with a MOSFET having a channel length of 1 µm.

FIGS. 1A to 1F are schematic cross sectional views showing CMOSFET production processes to form an LDD structure having such characteristics.

The left side 10 and the right side 20 in FIGS. 1A to 1F are the regions where a P-channel MOSFET and an N-channel MOSFET are respectively formed.

Figure 1A:
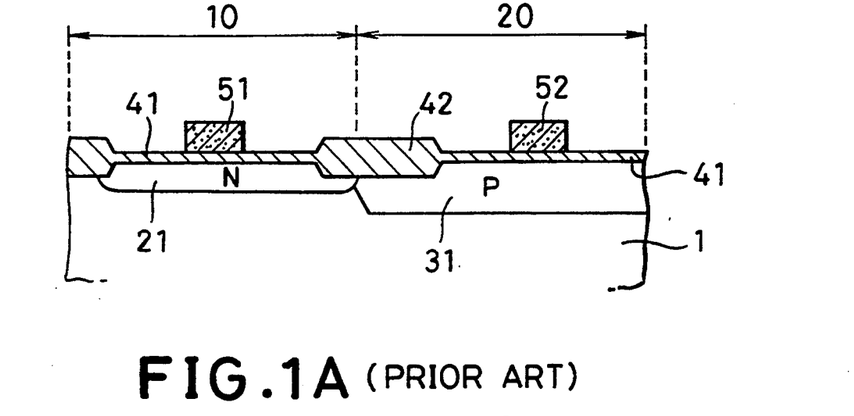
FIGS. 1A to 1F are schematic cross sectional views showing production processes of prior art semiconductor device, respectively.

First, an N-well 21 and a P-well 31 are formed in a silicon substrate 1 to separate the substrate into a P-channel MOSFET region and an N-channel MOSFET region. Then, a thin gate oxide film 41 and a thick field oxide film 42 are formed on the surface of these wells, and polycrystalline silicon is deposited on the gate oxide film 41 and patterned to form gates 51 and 52 (FIG. 1A).

Figure 1B:
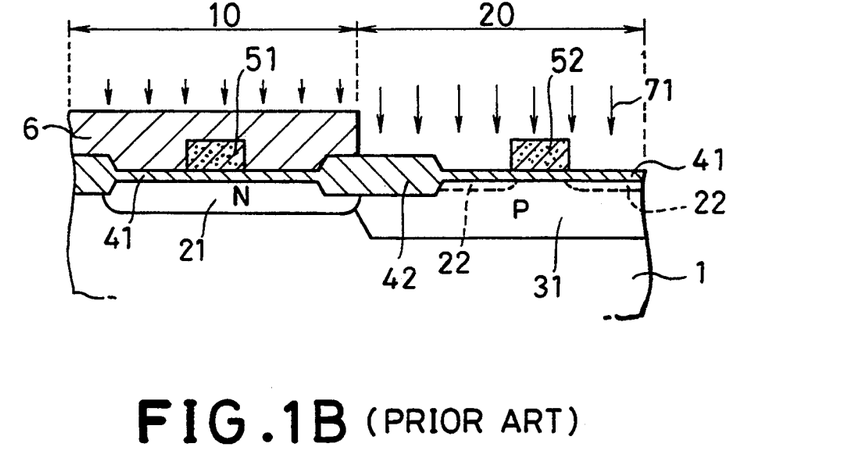

Then, to form source-drain regions of the N-channel MOSFET in the region 10, a resist film 6 is formed by using a photomask, and by using the resist film 6 and the gate 52 as a photomask is implanted in a region 22 a donor ion such as $^{31}P^+$ under the conditions of an acceleration voltage of 50 kV and an implantation amount of $3 \times 10^{13}/cm^2$ (FIG. 1B).

Figure 1C:
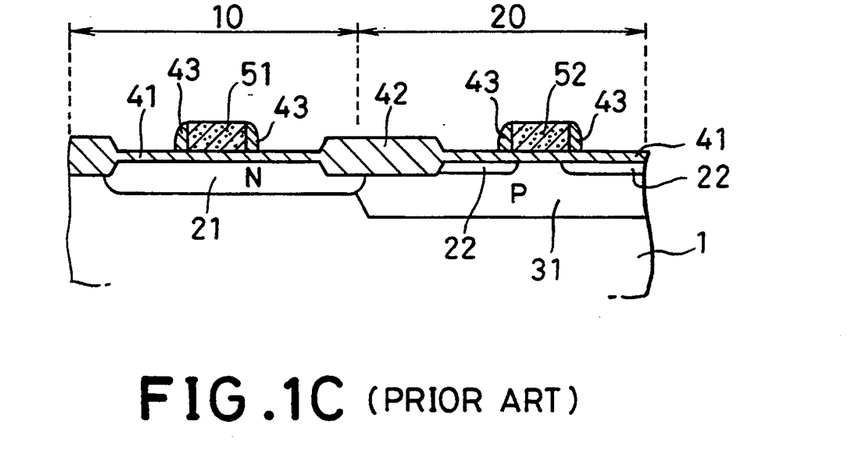

After that, the resist film 6 is removed and an oxide film 43 as a side wall is formed on the side portions of the gates 51 and 52 (FIG. 1C).

Figure 1D:
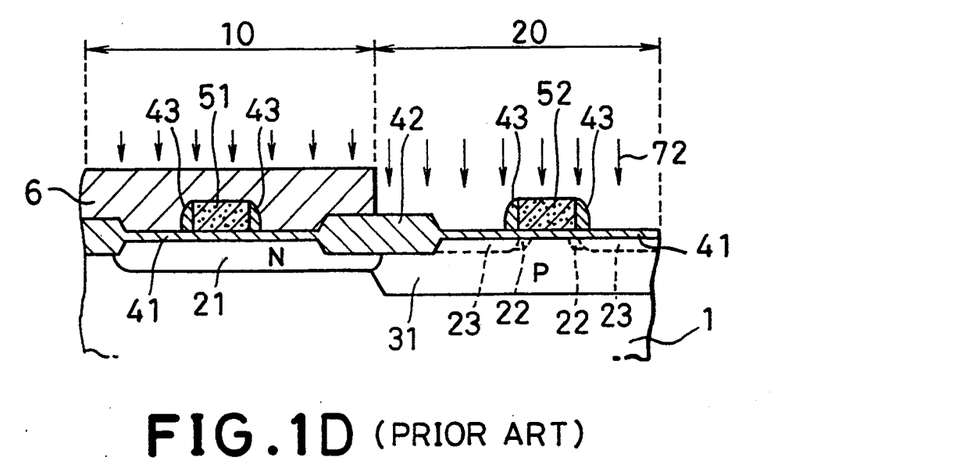

Further, the resist film 6 is formed in the region 10 by using a photomask, and by using the gate 52 and the oxide film 43 as a mask a donor ion 72 such as $As^+$ is implanted in a region 23, which is narrower than the region 22, under the conditions of an acceleration voltage of 50 kV and an implantation amount of $5 \times 10^{15}/cm^2$ (FIG. 1D).

Figure 1E:
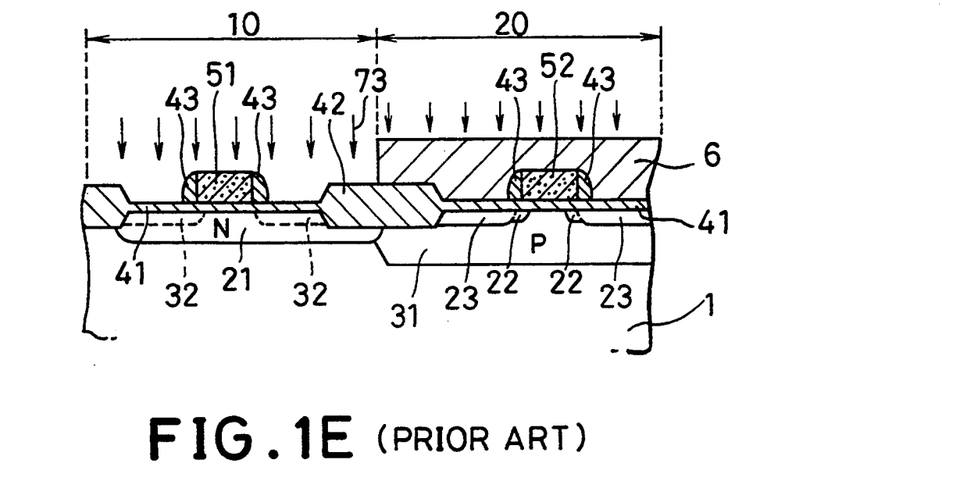

Then, after the resist film 6 is removed, to form the source-drain regions of the P-channel MOSFET in the region 10, the resist film 6 is formed only in the region 20 by using a photomask, and by using the resist film 6, the gate 51, and the oxide film 43 as a mask an acceptor ion 73 such as $BF_2^+$ is implanted in a region 32 under the conditions of an acceleration voltage of 50 kV and an implantation amount of $3 \times 10^{15}/cm^2$ (FIG. 1E).

Figure 1F:
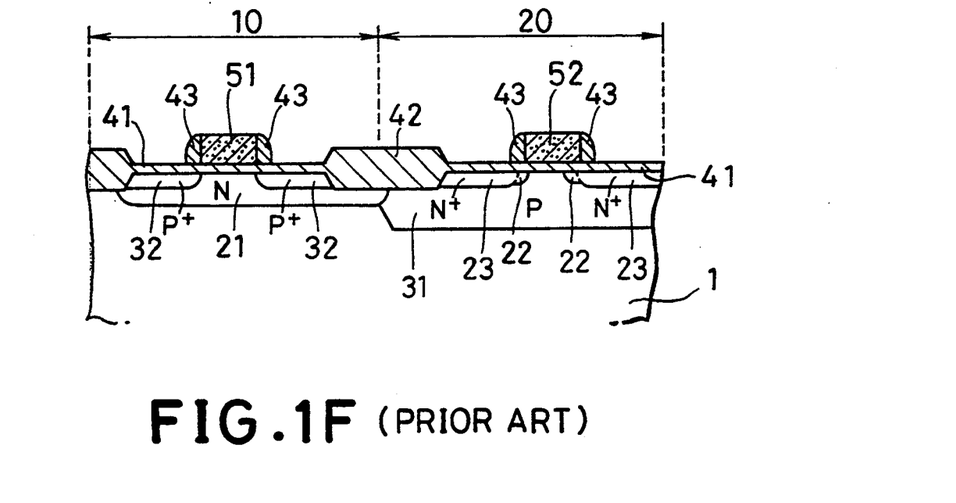

After that, the resist film 6 is removed, followed by heat treatment, to form a short channel portion between the $N^-$ regions 22 doped with a low-concentration of $^{31}P$. At the same time, the source-drain regions 23 doped with a high-concentration of As are formed outside the $N^-$ regions 22. Thus, the N-channel MOSFET of an LDD structure is formed. On the other hand, a P-channel MOSFET having the $P^+$ source-drain regions 32 doped with $^{11}B$ is formed in the region 10 (FIG. 1F).

Figure 2:
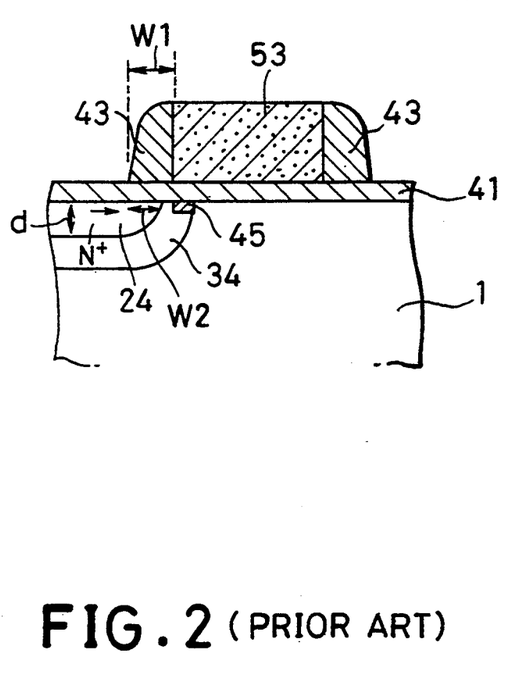
FIG. 2 is a schematic cross sectional view showing part of prior art N-channel DMOSFET.

However, there are some problems in the formation of a CMOSFET having LDD structure and the N-channel double-diffused MOSFET (DMOSFET) on the same silicon substrate 1. FIG. 2 shows a part of the N-channel DMOSFET. When implanting acceptor ions and donor ions by using a gate 53 consisting of polycrystalline silicon formed on the surface of the silicon substrate 1 via the oxide film 41 and the oxide film 43 at the side wall of the gate 53 as a mask and heat treating to form a P base region 34 and an $N^+$ source-drain regions 24 as shown in FIG. 2, if a width $W_1$ of the oxide film 43 is 0.2 µm and a depth d of the $N^+$ region 24 is 0.2 µm, a diffusion width $W_2$ in the lateral direction of the $N^+$ region 24 becomes 0.16 µm. In such a condition, an inversion layer 45 formed under the gate 53 will not reach the $N^+$ region 24, and will not be able to operate the N-channel DMOSFET. To solve the problem, when the source-drain regions of the N-channel DMOSFET and the P base region 34 are formed independently from each other by different processes, two additional mask processes are required, resulting in increased production time and cost.

SUMMARY OF THE INVENTION

An object of the present invention is to provide a method for producing a semiconductor device comprising a CMOSFET having a lightly doped drain structure and a double-diffused MOSFET formed on the same semiconductor substrate, thereby preventing the occurrence of malfunction.

In the first aspect of the present invention, a method for producing a semiconductor device having a CMOSFET and an N-channel double-diffused MOSFET in a semiconductor substrate, comprise the steps of:

forming source-drain regions by implanting a first dopant using a gate of an N-channel MOSFET constructing the CMOSFET as a mask;

forming source-drain regions and a p base region of the N-channel double-diffused MOSFET deeper than the source-drain regions by successively implanting a second dopant and a third dopant using gates of the N-channel double-diffused MOSFET as a mask;

forming oxide films on side walls of individual gates of the N-channel MOSFET, a P-channel MOSFET constructing the CMOSFET, and the N-channel double-diffused MOSFET; and forming an LDD structure by implanting into the source-drain regions of the N-channel MOSFET with a fourth dopant using the gate of the N-channel MOSFET and the oxide films as a mask.

Here, a method may further comprise the step of introducing a fifth dopant to form source-drain regions of the P-channel MOSFET of the CMOSFET and at the same time to form a P base contact region partly overlapping with the P base region of the N-channel double-diffused MOSFET.

The device may further comprise an NPN transistor formed in the semiconductor substrate and the method may further comprise the steps of forming source-drain regions of the NPN transistor by selectively introducing the second dopant simultaneously with the formation of the source-drain regions of the N-channel double-diffused MOSFET and forming a p base region of the NPN transistor by selectively introducing the third dopant simultaneously with the formation of the P base region of the N-channel double-diffused MOSFET.

A method may further comprise the step of introducing a fifth dopant to form source-drain regions of a P-channel MOSFET of the CMOSFET and at the same time to form a P base outer region partly overlapping with the P base region of the NPN transistor.

A method may further comprise the step of introducing a fifth dopant to form source-drain regions of the P-channel MOSFET of the CMOSFET and at the same time to form a P base contact region partly overlapping with the P base region of the N-channel double-diffused MOSFET.

In the second aspect of the present invention, a method for producing a semiconductor device having a CMOSFET and a P-channel double-diffused MOSFET in a same semiconductor substrate, comprising the steps of:

forming an N⁻ regions for preparing an LDD structure in an N-channel MOSFET constructing the CMOSFET and N base regions of the P-channel double-diffused MOSFET by implanting a first dopant using gates of the N-channel MOSFET and the P-channel double-diffused MOSFET as a mask;

forming oxide films on side walls of individual gates of the N-channel MOSFET, a P-channel MOSFET constructing the CMOSFET and the P-channel double-diffused MOSFET;

forming source-drain regions with an LDD structure of the N-channel MOSFET and an N+ base contact regions of the P-channel double-diffused MOSFET by implanting a second dopant using the gates of the P-channel double-diffused MOSFET as a mask;

forming source-drain regions of the P-channel MOSFET and source-drain regions of the P-channel double-diffused MOSFET by implanting a third dopant using the gates of the P-channel MOSFET and the P-channel double-diffused MOSFET and the oxide film formed on its side walls thereof as a mask.

Here, a method may further comprise the step of selectively introducing the first dopant to form an N base contact region partly overlapping with the N base region of the P-channel double-diffused MOSFET.

The above and other objects, effects, features and advantages of the present invention will become more apparent from the following description of embodiments thereof taken in conjunction with the accompanying drawings.

DETAILED DESCRIPTION OF THE PREFERRED EMBODIMENTS

FIGS. 3A to 3F are schematic cross sectional views showing the production processes of a semiconductor device by the method according to the present invention.

In FIGS. 3A to 3F, reference numerals 10, 20 and 30, respectively, indicate regions where a P-channel MOSFET, an N-channel MOSFET, and an N-channel DMOSFET are formed.

Figure 3A:
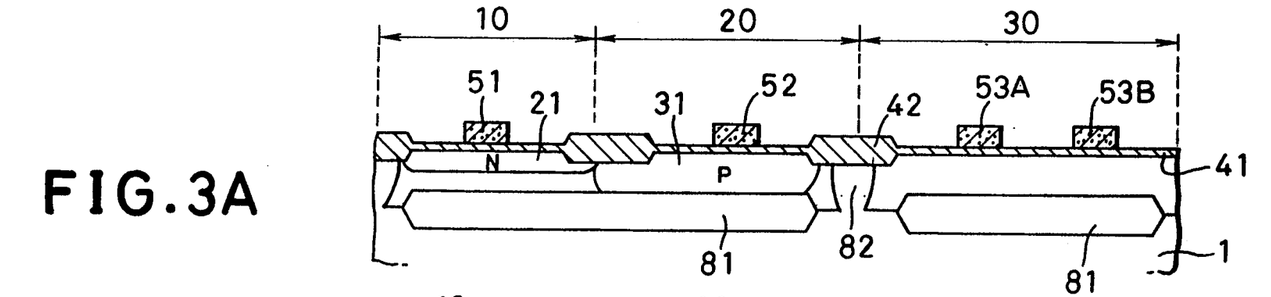
FIGS. 3A to 3F are schematic cross sectional views showing an embodiment of the production processes of a semiconductor device by the method according to the present invention, respectively.

In a silicon substrate 1 which is formed with a buried layer 81 and an isolation layer 82, an N-well 21 and a P-well 31 are formed, a field oxide film 42 by a LOCOS method and a gate oxide film 41 are formed on the surface of these wells and gates 51, 52, 53A, and 53B consisting of polycrystalline silicon are formed on the gate oxide film 41 (FIG. 3A).

Polycrystalline silicon is often used as a gate material. A refractory metal such as Mo, W, Ti, or Pt, or a silicide obtained by reacting one of these metals with polycrystalline silicon, or a polycide comprising a double-layered structure of silicide and polysilicon can be used to reduce the gate resistance even further.

Figures 3B, 3C:
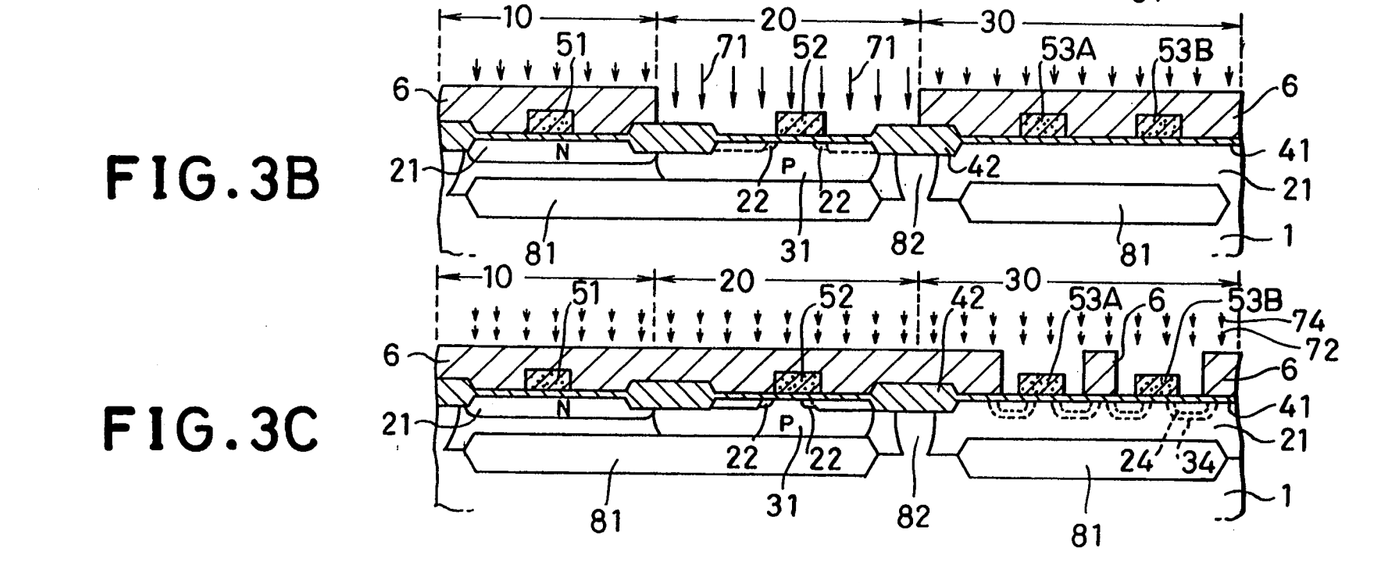

To form source-drain regions of the N-channel MOSFET in the region 20, a resist film 6 is formed in the regions 10 and 30 by using a photomask, and an N⁻ region 22 with a low dopant concentration for preparing the LDD structure is formed in the P-well 31 by ion-implanting $^{31}P^+$ 71 under the conditions of an acceleration voltage of 30 kV and an implantation amount of $3 \times 10^{13}/cm^2$ (FIG. 3B).

Then, to form an N-channel DMOSFET in the region 30, a photomask is used to leave the resist film 6 on the region 10 and the region 20, and the region between the gates 53A and 53B of the region 30. After that, As+ 72 is ion-implanted under the conditions of an acceleration voltage of 50 kV and an implantation amount of $5 \times 10^{15}/cm^2$ to form N+ source-drain regions 24. Furthermore, B+ 74 is ion-implanted under the conditions of an acceleration voltage of 30 kV and an implantation amount of $1.5 \times 10^{14}/cm^2$ to form a P base region 34 which is deeper than the N+ source-drain regions 24 (FIG. 3C). Thus, a double-diffused layer is formed.

Figure 3D:
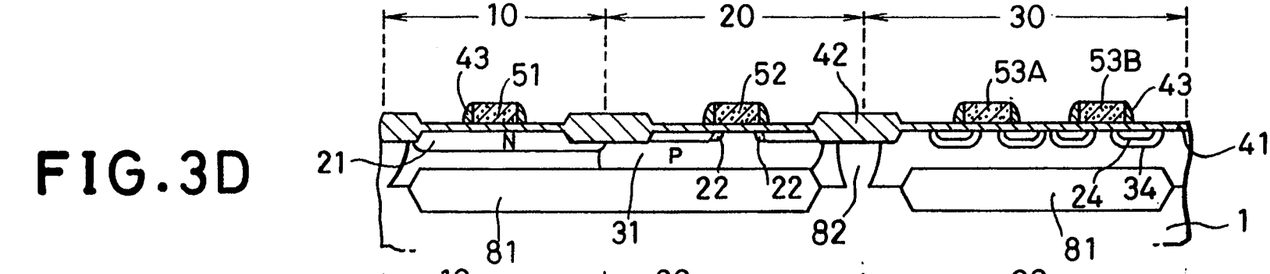

After that, an oxide film such as $SiO_2$ is deposited to a thickness of about 2,000 Å, for example, by a CVD or plasma CVD technique, and the oxide film is anisotropically etched in the vertical direction to leave an oxide film 43 only on the side portions of the gates 51, 52, 53A, and 53B (FIG. 3D).

Figure 3E:
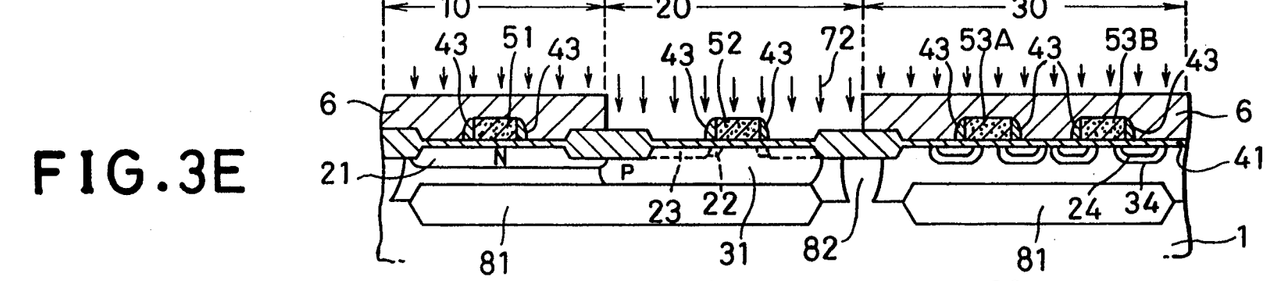

After the side wall spacers of the oxide film 43 are formed, with the resist film 6 left in the region 10 and the region 30, As+ 72 is ion-implanted under the conditions an acceleration voltage of 50 kV and an implantation amount of $5 \times 10^{15}/cm^2$ to form an N+ source-drain regions 23 of the N-channel MOSFET in the P-well 31. Thus, the LDD structure is formed in the P-well 31 (FIG. 3E).

Figure 3F:
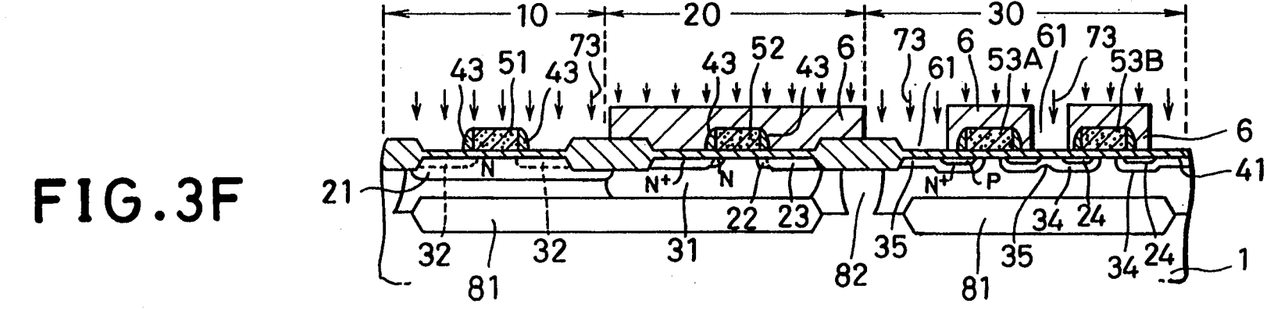

Then, the resist film 6 is removed from the region 10 and is left in the region 30 and an opening 61 is provided in the resist film 6 by using another photomask so that the opening 61 is provided on an edge of the P base region 34 or slightly inside the edge and furthermore, the resist film 6 is formed on the region 20. After that, BF$_2$+ 73 is ion-implanted from the opening 61 under the condition an acceleration voltage of 50 kV and an implantation amount of $5 \times 10^{15}/cm^2$ to form P+ source-drain regions 32 of the P-MOSFET and a P+ base-contact region 35 which connects with the P base region 34 (FIG. 3F). Thus, the N-channel DMOSFET can be operated.

As described above, the CMOSFET having the LDD structure including the N− region 22 and the N+ source-drain regions 23 in the region 20 and the N-channel DMOSFET including the N+ source-drain regions 24 and the P base-contact region 35, which partly overlaps with the P base region 34 in the region 30, can be formed on the same semiconductor substrate by merely adding a mask formation step to prior art process.

Figure 4A:
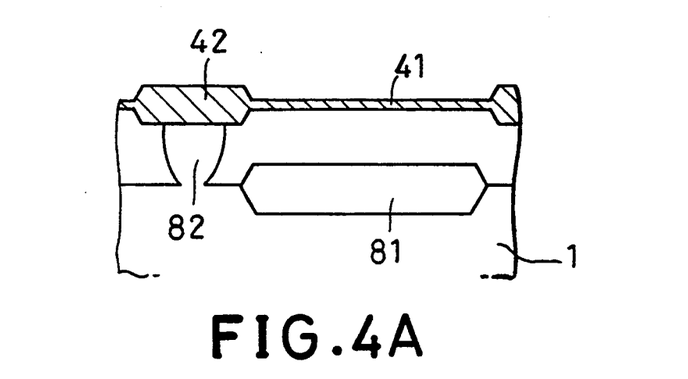
FIGS. 4A to 4F are schematic cross sectional views showing production processes when an NPN transistor is added to the semiconductor device produced by the processes shown in FIGS. 3A to 3F, respectively.

FIGS. 4A to 4F are schematic cross sectional views showing production processes when an NPN bipolar transistor is added to the semiconductor device produced by the processes shown in FIGS. 3A to 3F. The field oxide film 42 and the gate oxide film 41 are formed on the surface of the silicon substrate 1 which is formed with the buried layer 81 and the isolation layer 82, simultaneously with the process in FIG. 3A (FIG. 4A).

Figure 4B:
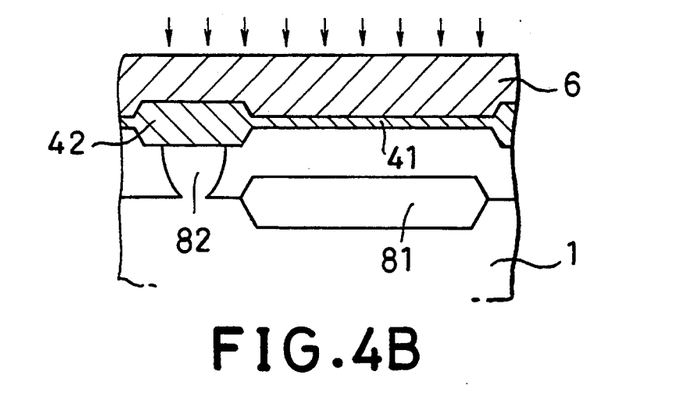

Simultaneously with the process in FIG. 3B, the resist film 6 is formed on the field oxide film 42 and the gate oxide film 41 (FIG. 4B).

Figure 4C:
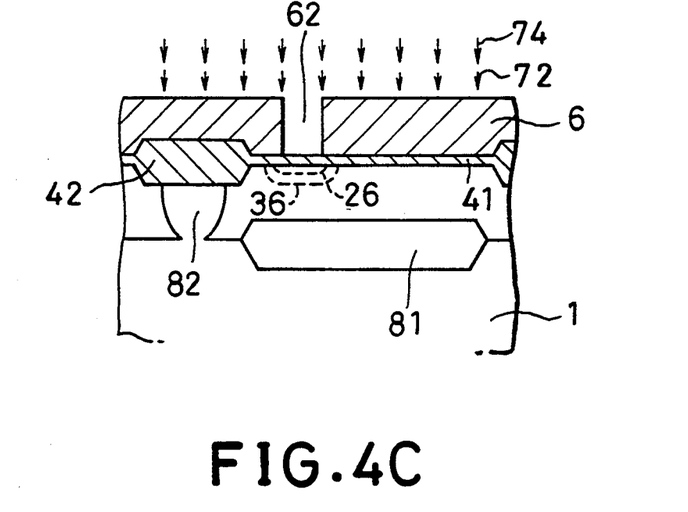

During the process shown in FIG. 3C where the DMOSFET region is ion-implanted with As+ 72 and B+ 74 to form the N+ source-drain regions 24 and the P base region 34, ion-implantation is made through an opening 62 of the resist film 6 to form an emitter region 26 and a base region 36 of the NPN transistor (FIG. 4C).

Figure 4D:
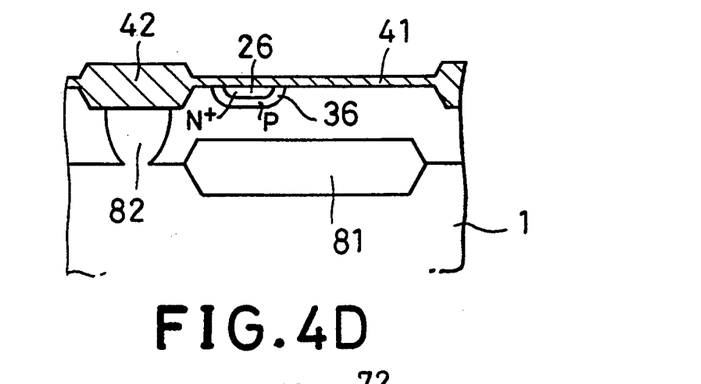

The process shown in FIG. 4D is the same process as the side wall formation process in FIG. 3D, and the region is not specifically treated.

Figure 4E:
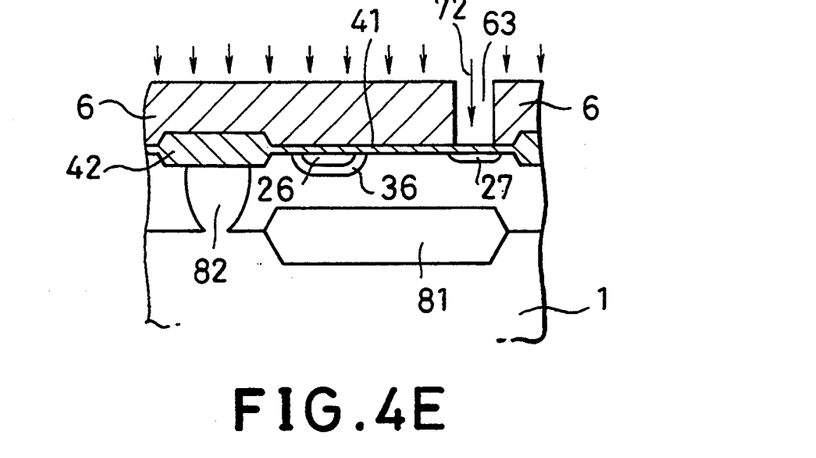

At the forming process of the N+ source-drain regions of the N-channel FET of CMOS by ion-implanting with As+ 72, a region 27 is ion-implanted with the same ion through an opening 63 of the resist film 6 to form an N+ collector region (FIG. 4E).

Figure 4F:
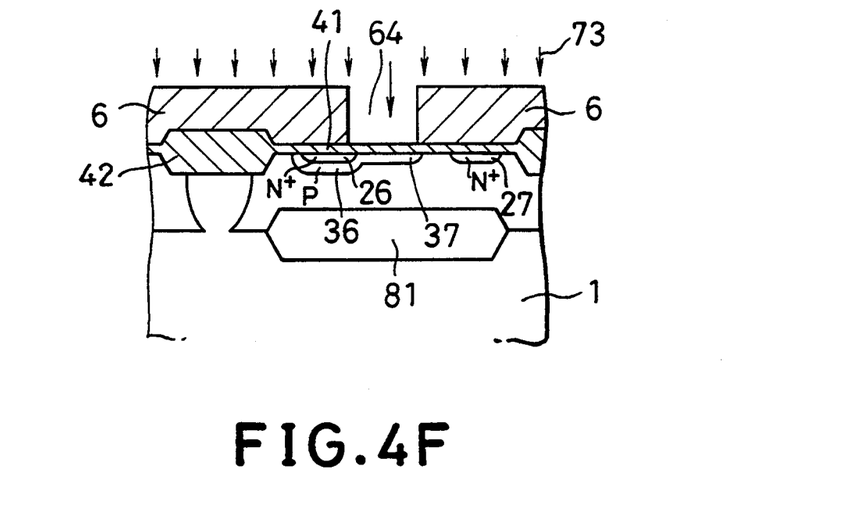

Then, during the process forming the P base-contact region 35 of the N-channel DMOSFET, shown in FIG. 3F to form a P-type outer base region 37 for making contact with the P base region 36 by lateral diffusion, an opening 64 at the edge of the P base region 36 or overlapping with the region 36 is provided in the resist film 6 by using a photomask and BF$_2$+ is ion-implanted (FIG. 4F).

Thus, the NPN bipolar transistor including the emitter region 26 and the outer base region 37 which partly overlaps with the base region 36 can be formed. As a result, a semiconductor device integrated with the NPN bipolar transistor can be formed on the same semiconductor substrate.

FIGS. 5A to 5E are schematic cross sectional views showing another production processes of the semiconductor device by the method according to the present invention.

In FIGS. 5A to 5E, reference numerals 10, 20 and 40, respectively indicate regions where a P-channel MOSFET, an N-channel MOSFET, and an N-channel DMOSFET are formed.

Figure 5A:
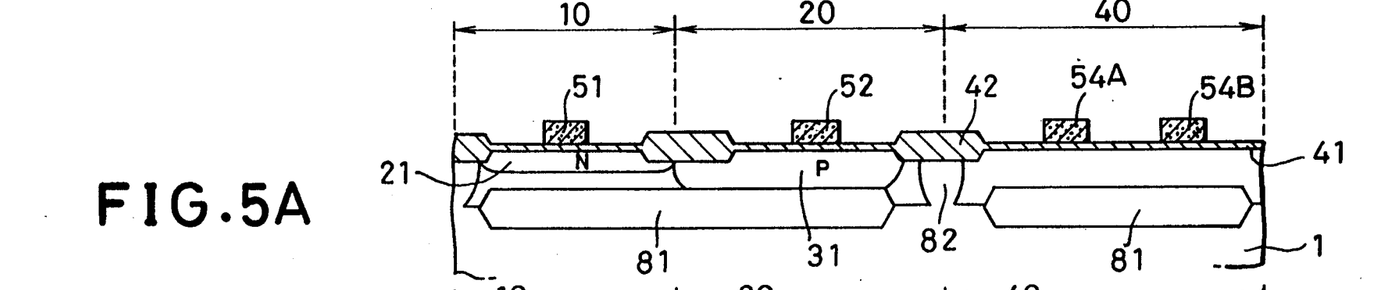
FIGS. 5A to 5E are schematic cross sectional views showing another embodiment of production processes for a semiconductor device by the method according to the present invention, respectively.

The N-well 21 and the P-well 31 are formed in the silicon substrate 1 which is formed with the buried layer 81 and the isolation layer 82, the field oxide film 42 by the LOCOS method and the gate oxide film 41 are formed on the surface of these wells, and the gates 51, 52, 54A, and 54B consisting of polycrystalline silicon are formed on the gate oxide film 41 (FIG. 5A).

Figure 5B:
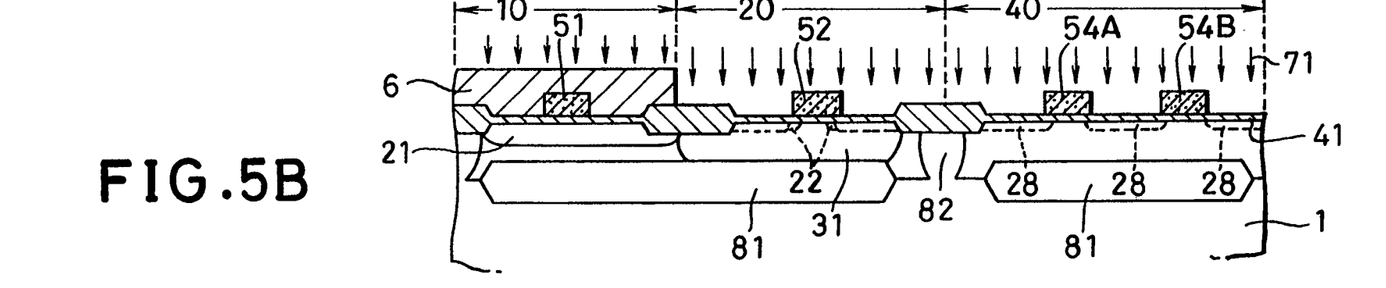

The resist film 6 is formed only in the region 10, the P-well 31 is ion-implanted with P+ 71 using the gate 52 as a mask to form the N− region 22 in the region 20 for preparing an LDD structure and, at the same time, ion-implantation is made with P+ 71 using the gates 54A and 54B as a mask to form an N base region 28 in the region 40 (FIG. 5B).

Figure 5C:
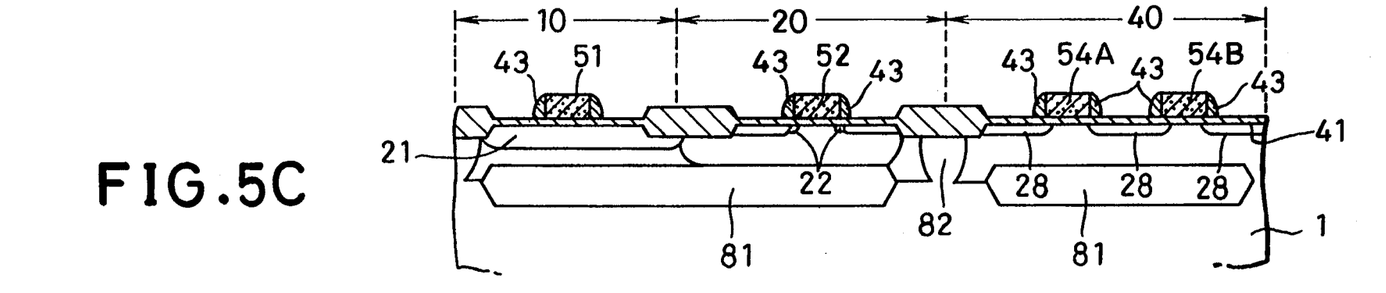

The resist film 6 is removed in the region 10, an oxide film is deposited, for example, to a thickness of about 2,000 Å, and the oxide film is anisotropically etched to leave the oxide film 43 only on the side portions of the gates 51, 52, 54A, and 54B (FIG. 5C).

Figure 5D:
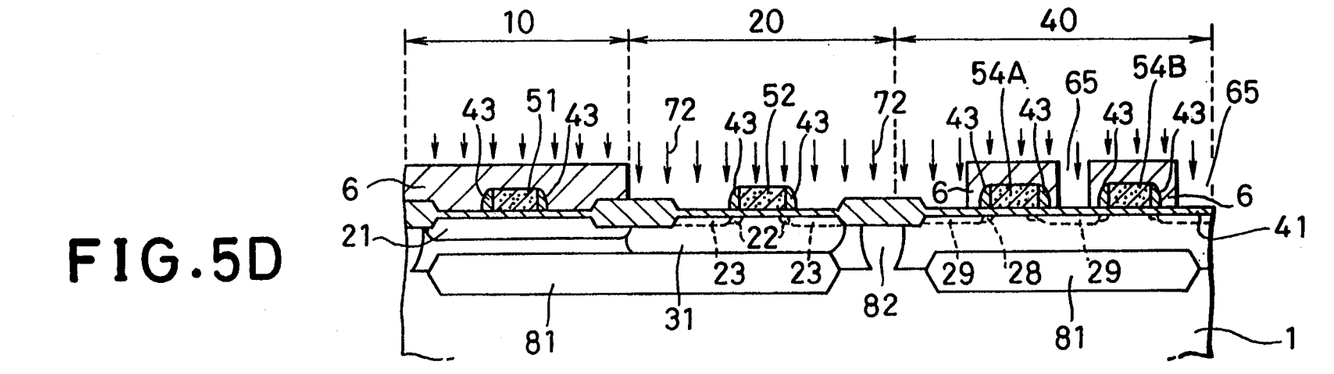

The resist film 6 is coated in the region 10 and the region 40, and the resist film 6 in the region 40 is provided with an opening 65. Then, As ion 72 is ion-implanted to form the N+ source-drain regions 23 of the N-channel MOSFET in the region 20, and an N+ base-contact region 29 of the N-channel DMOSFET in the region 40 (FIG. 5D).

Then, the resist 6 is removed and further a photomask is used to form the resist film 6 in the regions 20 and 40 and provide an opening 66 in the resist film in the vicinity of the gates 54A and 54B in the region 40. After that, ion-implantation is made with BF$_2$+ 73 to form the P+ source-drain regions 32 of the P-channel MOSFET in the region 10, and P+ source-drain regions 38 of the P-channel DMOSFET in the region 40 (FIG. 5E).

Since the diffusion coefficient of boron is high and boron deeply penetrates by heat treatment, the width of the N base region 28 surrounding the P+ source-drain regions 38 becomes narrow. As a result, since it will never occur that the inversion layer does not reach the source-drain regions as in the N-channel DMOSFET shown in FIG. 2, the N base region 28 and the N base contact region 29 can be securely connected. This can operate the N-channel DMOSFET.

As described above, the CMOSFET having an LDD structure comprising the N− region 22 and the N+ source-drain regions 23 in the region 20, and the DMOSFET having a double-diffused drain structure comprising the P+ source-drain regions 38 and the N base region 28 in the region 40 can be formed on the same semiconductor substrate.

Figure 5E:
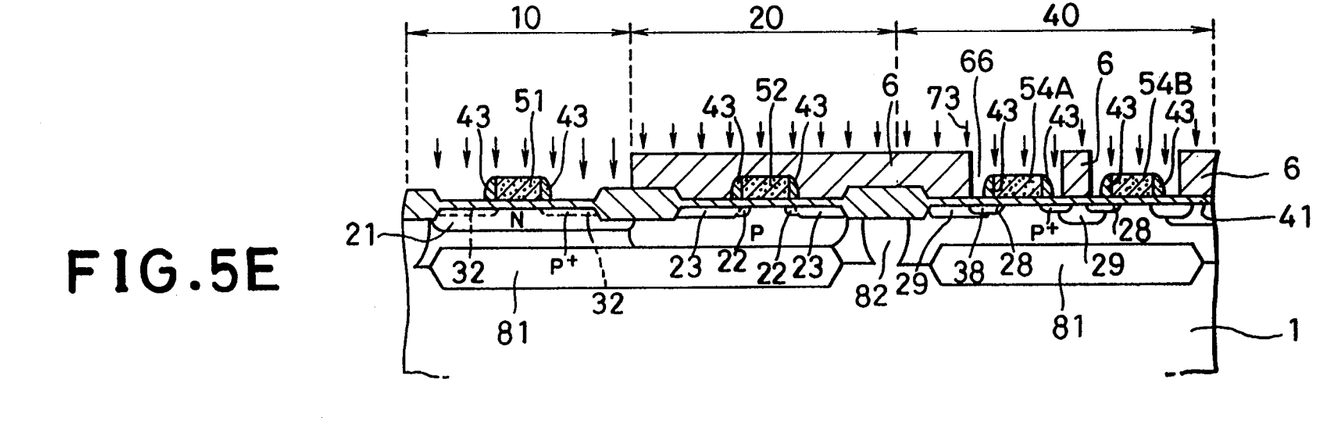

NTN transistor shown in FIGS. 4A to 4C can be formed in the same semiconductor substrate, in which the device shown in FIG. 5E, in the similar manner as described before.

The present invention has been described in detail with respect to preferred embodiments, and it will now be that changes and modifications may be made without departing from the invention in its broader aspects, and it is the intention, therefore, in the appended claims to cover all such changes and modifications as fall within the true spirit of the invention.

What is claimed is:

1. A method for producing a semiconductor device having a CMOSFET and an N-channel double-diffused MOSFET in a semiconductor substrate, comprising the steps of:
    forming source-drain regions by implanting a first dopant using a gate of an N-channel MOSFET constructing said CMOSFET as a mask;
    forming source-drain regions and a p base region of said N-channel double-diffused MOSFET deeper than said source-drain regions by successively implanting a second dopant and a third dopant using gates of said N-channel double-diffused MOSFET as a mask;
    forming oxide films on side walls of individual gates of the N-channel MOSFET, a P-channel MOSFET constructing said CMOSFET, and said N-channel double-diffused MOSFET; and
    forming an LDD structure by implanting into the source-drain regions of said N-channel MOSFET with a fourth dopant using the gate of said N-channel MOSFET and said oxide films as a mask.

2. A method as claimed in claim 1, further comprising the step of introducing a fifth dopant to form source-drain regions of said P-channel MOSFET of said CMOSFET and at the same time to form a P base contact region partly overlapping with said P base region of said N-channel double-diffused MOSFET.

3. A method as claimed in claim 1, wherein said device further comprising an NPN transistor formed in said semiconductor substrate and the method further comprising the steps of forming source-drain regions of said NPN transistor by selectively introducing said second dopant simultaneously with the formation of the source-drain regions of said N-channel double-diffused MOSFET and forming a p base region of said NPN transistor by selectively introducing said third dopant simultaneously with the formation of the P base region of said N-channel double-diffused MOSFET.

4. A method as claimed in claim 3, further comprising the step of introducing a fifth dopant to form source-drain regions of a P-channel MOSFET of said CMOSFET and at the same time to form a P base outer region partly overlapping with the P base region of said NPN transistor.

5. A method as claimed in claim 3, further comprising the step of introducing a fifth dopant to form source-drain regions of said P-channel MOSFET of said CMOSFET and at the same time to form a P base contact region partly overlapping with said P base region of said N-channel double-diffused MOSFET.

6. A method for producing a semiconductor device having a CMOSFET and a P-channel double-diffused MOSFET in a same semiconductor substrate, comprising the steps of:
    forming an N− regions for preparing an LDD structure in an N-channel MOSFET constructing said CMOSFET and N base regions of said P-channel double-diffused MOSFET by implanting a first dopant using gates of said N-channel MOSFET and said P-channel double-diffused MOSFET as a mask;
    forming oxide films on side walls of individual gates of the N-channel MOSFET, a P-channel MOSFET constructing said CMOSFET and the P-channel double-diffused MOSFET;
    forming source-drain regions with an LDD structure of said N-channel MOSFET and an N+ base contact regions of said P-channel double-diffused MOSFET by implanting a second dopant using the gates of said P-channel double-diffused MOSFET as a mask;
    forming source-drain regions of said P-channel MOSFET and source-drain regions of said P-channel double-diffused MOSFET by implanting a third dopant using the gates of said P-channel MOSFET an said P-channel double-diffused MOSFET and the oxide film formed on its side walls thereof as a mask.

7. A method as claimed in claim 6, further comprising the step of selectively introducing said first dopant to form an N base contact region partly overlapping with the N base region of said P-channel double-diffused MOSFET.

* * * * *